(12) United States Patent
Matsui et al.

(10) Patent No.: US 10,222,536 B2
(45) Date of Patent: Mar. 5, 2019

(54) LIGHTING DEVICE, DISPLAY DEVICE, AND TELEVISION DEVICE

(71) Applicant: Sharp Kabushiki Kaisha, Sakai, Osaka (JP)

(72) Inventors: Keitaro Matsui, Sakai (JP); Masanobu Harada, Sakai (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 15/554,459

(22) PCT Filed: Mar. 11, 2016

(86) PCT No.: PCT/JP2016/057729
§ 371 (c)(1),
(2) Date: Aug. 30, 2017

(87) PCT Pub. No.: WO2016/148052
PCT Pub. Date: Sep. 22, 2016

(65) Prior Publication Data
US 2018/0045874 A1 Feb. 15, 2018

(30) Foreign Application Priority Data
Mar. 18, 2015 (JP) .................................. 2015-054629

(51) Int. Cl.
*F21V 8/00* (2006.01)
*G02F 1/1335* (2006.01)
(Continued)

(52) U.S. Cl.
CPC ................ *G02B 6/005* (2013.01); *F21V 9/30* (2018.02); *G02B 6/009* (2013.01); *G02B 6/0055* (2013.01);
(Continued)

(58) Field of Classification Search
CPC ..... G02B 6/005; G02B 6/0055; G02B 6/0056; G02B 6/0066; G02B 6/0068;
(Continued)

(56) References Cited

U.S. PATENT DOCUMENTS 8,310,145 B2 11/2012 Mitsuishi et al.
8,343,575 B2 1/2013 Dubrow
(Continued)

FOREIGN PATENT DOCUMENTS

CN 101871598 A 10/2010
CN 102403429 A 4/2012
(Continued)

*Primary Examiner* — Laura Gudorf
(74) *Attorney, Agent, or Firm* — Keating & Bennett, LLP

(57) ABSTRACT

A lighting device includes a light source line, a light guide plate, and a wavelength converting member. The light source line includes an inner light source and outer light sources. The inner light source is disposed in the middle and configured to emit primary light rays in a predefined wavelength range. The outer light sources are disposed outer than the inner light source and configured to emit primary light rays and complementary color light rays. The light guide plate includes a light entering surface and a light exiting surface. The wavelength converting member contains first phosphors configured to emit secondary light rays in a wavelength range different from the wavelength range when excited by the primary light rays. The wavelength converting member is disposed to cover the light exiting surface and configured to pass some of the primary light rays and to release planar light.

14 Claims, 7 Drawing Sheets

(51) Int. Cl.
*F21V 9/30* (2018.01)
*H01L 33/00* (2010.01)
*H04N 5/64* (2006.01)

(52) U.S. Cl.
CPC ......... *G02B 6/0056* (2013.01); *G02B 6/0088* (2013.01); *G02F 1/133621* (2013.01); *H01L 33/00* (2013.01); *G02F 2001/133614* (2013.01); *G02F 2202/36* (2013.01); *H04N 5/64* (2013.01)

(58) Field of Classification Search
CPC .... G02B 6/0073; G02B 6/0088; G02B 6/009; G02F 1/133621; G02F 2001/133614; G02F 2202/36; H04N 5/64
See application file for complete search history.

(56) References Cited

U.S. PATENT DOCUMENTS

| | | | |
|---|---|---|---|
| 8,471,277 B2 | 6/2013 | Mitsuishi et al. |
| 8,697,471 B2 | 4/2014 | Dubrow |
| 9,139,767 B2 | 9/2015 | Dubrow |
| 9,199,842 B2 | 12/2015 | Dubrow et al. |
| 9,435,938 B2 | 9/2016 | Yamashita et al. |
| 9,817,270 B2 | 11/2017 | Nagatani et al. |
| 2010/0167011 A1 | 7/2010 | Dubrow |
| 2012/0056224 A1 | 3/2012 | Mitsuishi et al. |
| 2012/0056526 A1 | 3/2012 | Mitsuishi et al. |
| 2012/0113672 A1 | 5/2012 | Dubrow et al. |
| 2013/0075014 A1 | 3/2013 | Dubrow |
| 2014/0178648 A1 | 6/2014 | Dubrow |
| 2015/0009454 A1 | 1/2015 | Nagatani et al. |
| 2015/0023057 A1* | 1/2015 | Kim ..................... G02B 6/0011 362/609 |
| 2015/0124195 A1* | 5/2015 | Chen .................. G02F 1/133512 349/61 |
| 2015/0219832 A1* | 8/2015 | Baek .................... G02B 6/0031 362/607 |
| 2015/0226911 A1 | 8/2015 | Yamashita et al. |
| 2015/0300600 A1 | 10/2015 | Dubrow et al. |
| 2016/0009988 A1 | 1/2016 | Dubrow |
| 2016/0282667 A1* | 9/2016 | Fan ..................... G02B 6/0023 |
| 2016/0349428 A1 | 12/2016 | Dubrow et al. |
| 2016/0363713 A1 | 12/2016 | Dubrow et al. |
| 2017/0219759 A1* | 8/2017 | Oh ....................... G02B 6/0026 |

FOREIGN PATENT DOCUMENTS

| | | |
|---|---|---|
| CN | 104279426 A | 1/2015 |
| JP | 2013-544018 A | 12/2013 |
| KR | 10-2013-0064651 A | 6/2013 |
| WO | 2014/046140 A1 | 3/2014 |

\* cited by examiner

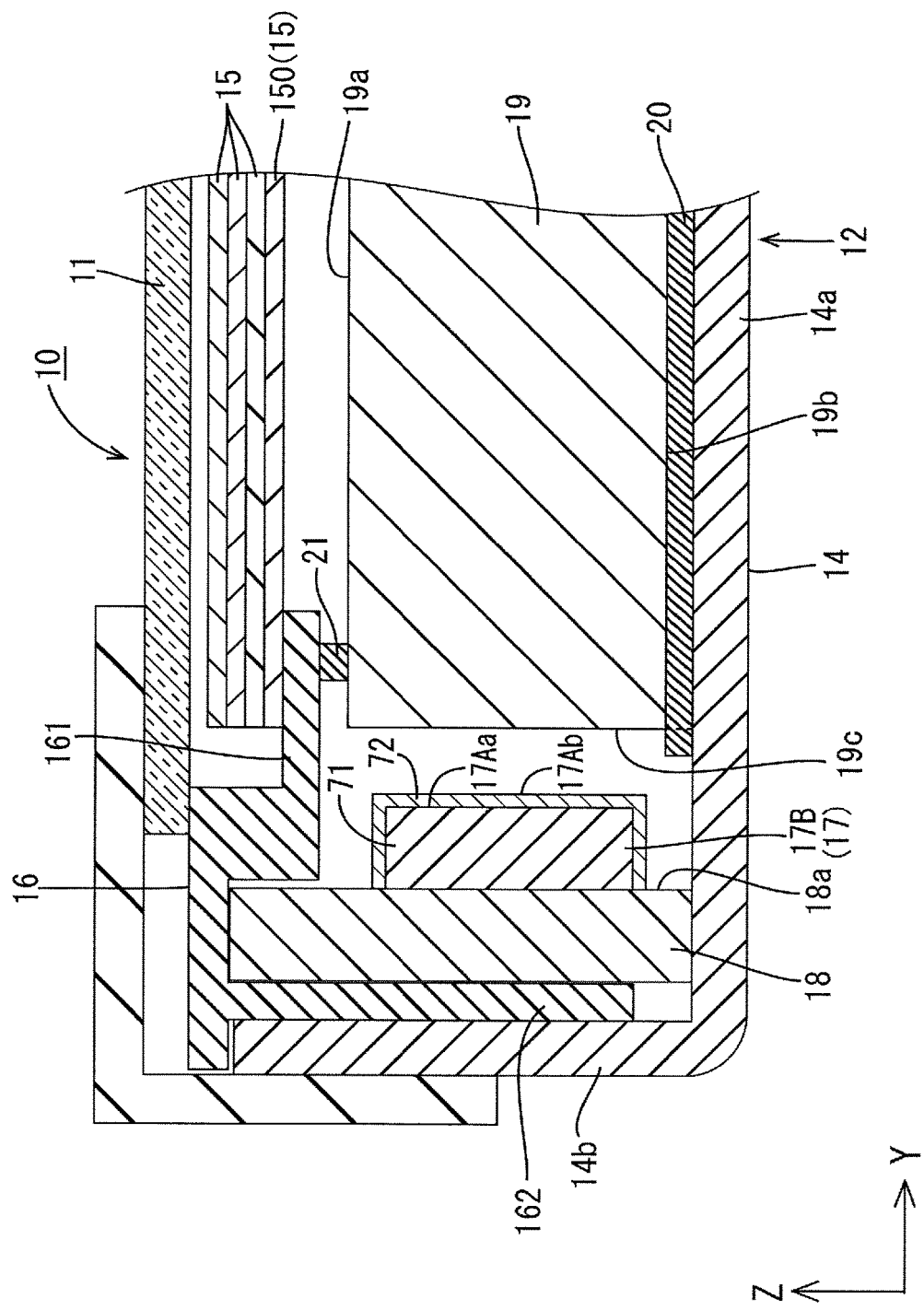

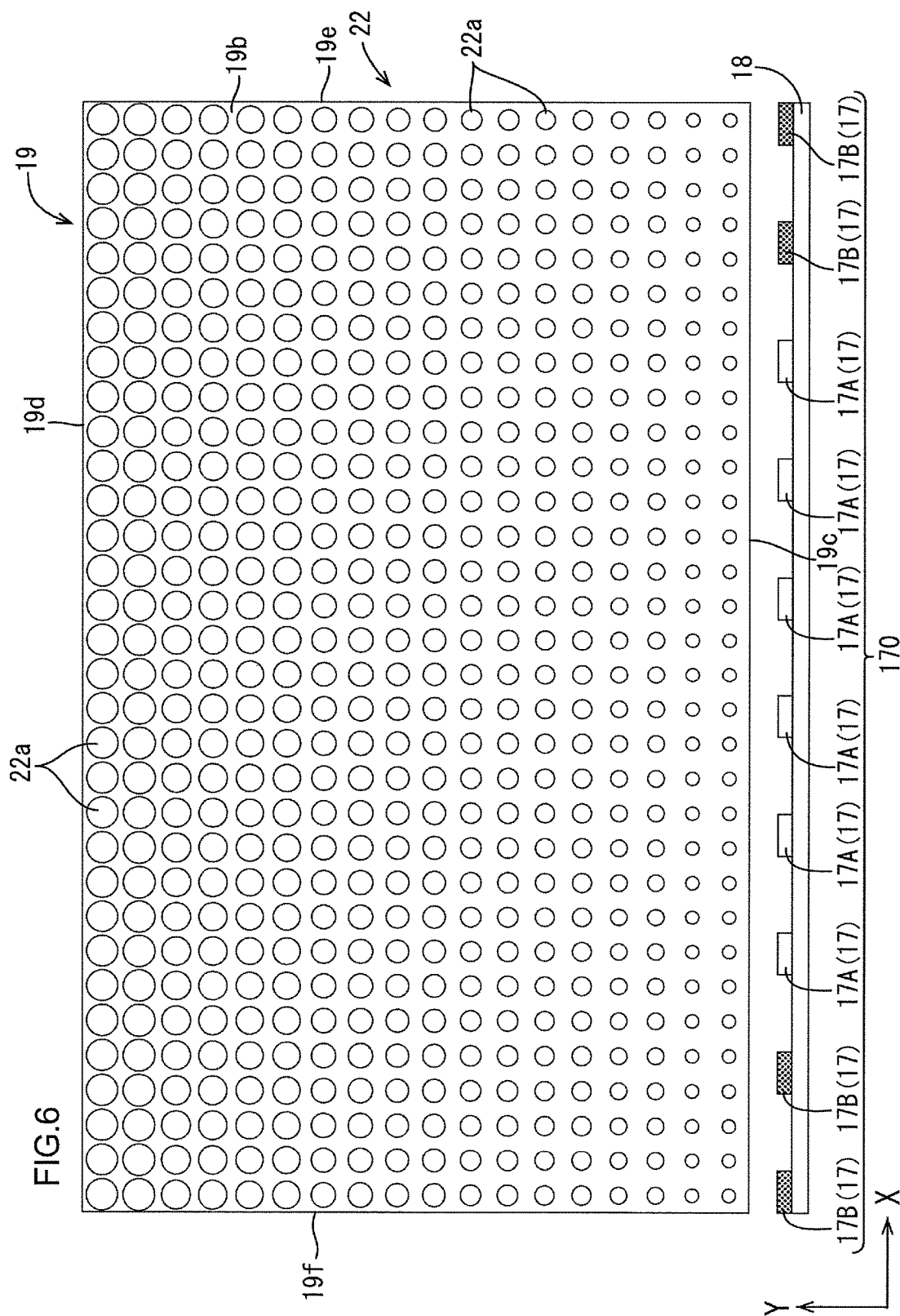

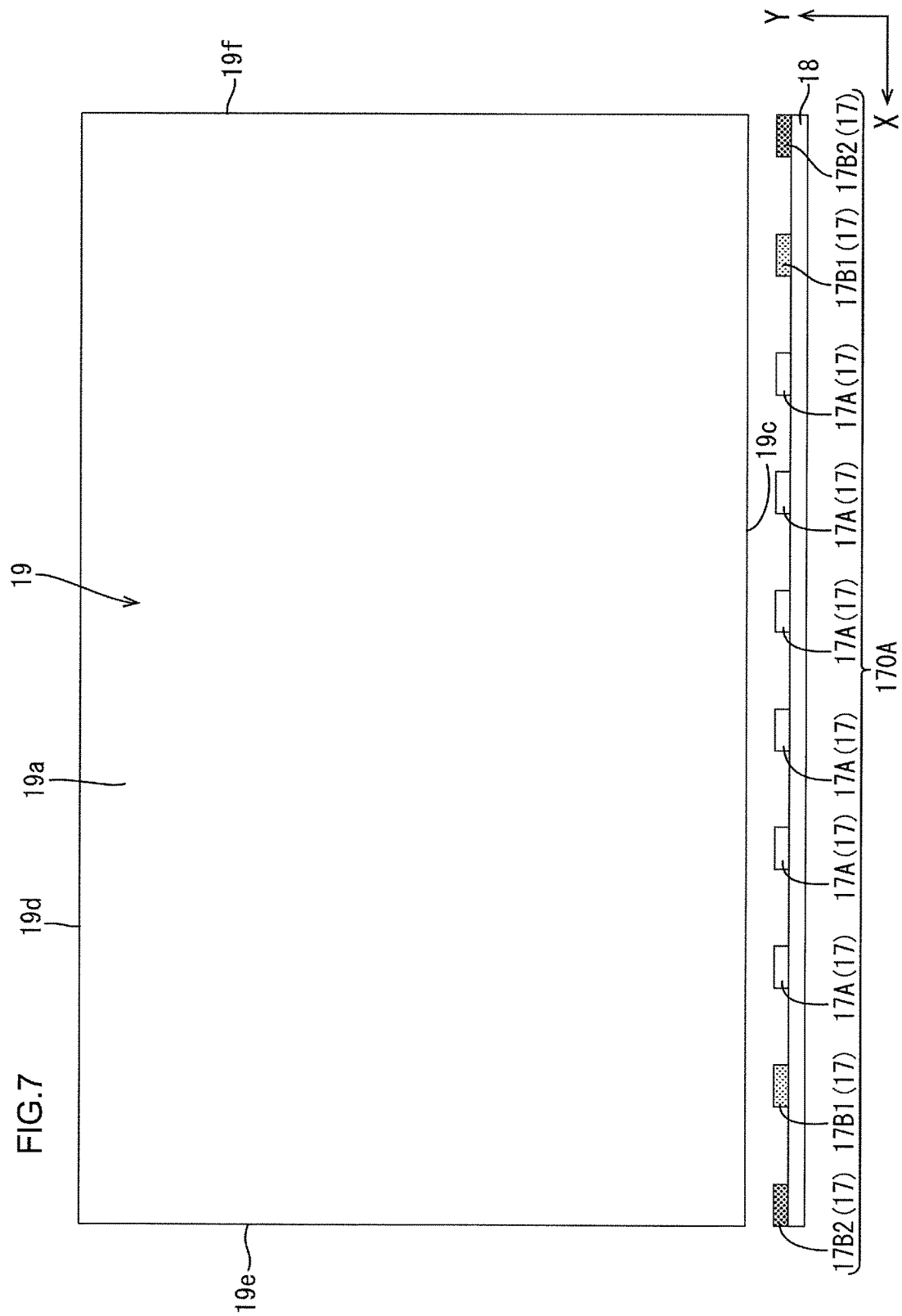

LIGHTING DEVICE, DISPLAY DEVICE, AND TELEVISION DEVICE

TECHNICAL FIELD

The present invention relates to a lighting device, a display device, and a television device.

BACKGROUND ART

A liquid crystal display device includes a liquid crystal panel and a lighting unit (a backlight unit) configured to supply light to the liquid crystal panel. As an example of such a backlight unit, an edge light type backlight unit (or a side light type backlight unit) has been known. In such a backlight unit, light emitting diodes (LEDs) are disposed along an end surface of a light guide plate. Such a backlight unit is disposed behind the liquid crystal panel to supply planar light to the back surface of the liquid crystal panel.

Recently, a lighting device including a phosphor sheet that is an optical member that covers a light guide plate is known (e.g., Patent Document 1). The phosphor sheet contains quantum dot phosphors. In such a lighting device, some of primary light rays emitted by LEDs (e.g., blue light rays) which reach the phosphor sheet excite the quantum dot phosphors in the phosphor sheet and the rest of the light rays pass through the phosphor sheet. When the quantum dot phosphors are excited by the primary light rays, the quantum dot phosphors emit secondary light rays with wavelengths different from those of the primary light rays (e.g., green light rays and red light rays). The secondary light rays exiting from the phosphor sheet are mixed with the primary light rays passing through the film, resulting in emission of white planar light from the phosphor sheet.

In a lighting device of this kind, optical sheets including a lens sheet and a reflective-type polarizing sheet are disposed over a phosphor sheet. Therefore, light rays exiting the light guide plate through a light exiting surface are repeatedly retroreflected by the optical sheets or other components to travel toward a back surface of a display panel. Namely, the light rays exiting the light guide plate through the light exiting surface are directed to the phosphor sheet for multiple times. With the quantum dot phosphors in the phosphor sheet, the light rays are efficiently converted to light rays with other wavelengths.

RELATED ART DOCUMENT

Patent Document

Patent Document 1: Japanese Translation of PCT international Application Publication No. 2013-544018

Problem to be Solved by the Invention

Light exiting from an edge region (a peripheral region) of the light exiting surface of the lighting device include a larger number of the primary light rays that exit without wavelength conversion in comparison to light exiting from a center region of the light exiting surface of the lighting device. This may be because the light rays in the edge region are retroreflected for the smaller number of times. Therefore, the light exiting from the edge region (the peripheral region) may be tinted a color of the primary light rays (e.g., blue) more than the light exiting from the center region.

DISCLOSURE OF THE PRESENT INVENTION

The present invention was made in view of the above circumstances. An object is to provide a technology for reducing color unevenness in exiting light that is tinted a color of primary light rays from a light source more in an edge portion than in a center portion of an edge light type lighting device.

Means for Solving the Problem

A lighting device according to the present invention includes a light source line, a light guide plate, and a wavelength converting member. The light source line includes light sources including an inner light source and outer light sources. The inner light source is disposed in a middle of the light source line and configured to emit primary light rays in a predefined wavelength range. The outer light sources are disposed closer to ends of the light source line than the inner light source, respectively. The outer light sources are configured to emit the primary light rays and complementary color light rays that exhibit a color that makes a complementary color pair with a reference color that is exhibited by the primary light rays. The light guide plate includes a light entering surface through which the light rays from the inner light sources and the outer light sources enter and a light exiting surface through which the light rays entering through the light entering surface exit. The light entering surface is opposed to the light source line. The wavelength converting member contains first phosphors that re configured to emit secondary light rays in a wavelength range different from the wavelength range when excited by the primary light rays. The wavelength converting member is disposed to cover the light exiting surface and configured to pass some of the primary light rays and to release planar light. According to the configuration, the light exiting from the lighting device is less likely to be tinted the color of the primary light rays more in the edge portion than in the center portion.

In the lighting device, the outer light sources may include reference light sources and wavelength converting members. The reference light sources may be configured to emit primary light rays. The wavelength converting members may be formed to cover the reference light sources. The wavelength converting members may be configured to pass the first light rays. The wavelength converting members may contain second phosphors that are configured to release the secondary light rays when excited by some of the primary light rays.

In the lighting device, the wavelength converting members may be films that contain the second phosphors. The wavelength converting members that are the films containing the second phosphors can be easily formed.

In the lighting device, the outer light sources may be configured to emit whitish light rays.

In the lighting device, the outer light sources may be arranged in line. The outer light sources may be configured such that the light rays from the light sources become more whitish from a middle of the light source line toward ends of the light source line.

In the lighting device, the inner light source and the reference light sources of the outer light sources may be the same type. Because common parts can be used for the inner light source and the reference light sources of the outer light sources, high productivity can be achieved and on-off control of the light sources can be easily performed.

In the lighting device, the primary light rays may be blue light rays. The wavelength converting member may contain at least green phosphors and red phosphors for the first phosphors. The green phosphors may be configured to release green light rays as the second light rays when excited by the blue light rays that are the primary light rays. The red phosphors may be configured to release red light rays as the second light rays when excited by the blue light rays that are the primary light rays. The complementary color light rays emitted by the outer light sources may be yellow light rays.

In the lighting device, the wavelength converting members of the outer light sources may contain at least second green phosphors and second red phosphors for the second phosphors. The second green phosphors may be configured to release green light rays when excited by the blue light rays. The second red phosphors may be configured to release red light rays when excited by the blue light rays.

In the lighting device, the wavelength converting member may include quantum dot phosphors from the first phosphors.

The lighting device may further include a reflective-type polarizing member that is disposed to cover the wavelength converting member.

A display device according to the present invention includes the lighting device and a display panel that is configured to display an image using light from the lighting device.

The display panel may be a liquid crystal display panel.

A television device according to the present invention includes the display device.

Advantageous Effect of the Invention

According to the present invention, a technology for reducing color unevenness in exiting light including light rays that are tinted a color of primary light rays from a light source more at an end than in a center portion is provided.

BRIEF DESCRIPTION OF THE DRAWINGS

FIG. 5 is a magnified cross-sectional view of a portion of the liquid crystal display device including an outer light source and therearound.

FIG. 6 is a plan view schematically illustrating a positional relationship between the LED line and the light guide plate viewed from a rear side.

FIG. 7 is a plan view schematically illustrating a positional relationship between an LED line and a light guide plate in a lighting unit according to a second embodiment.

MODE FOR CARRYING OUT THE INVENTION

First Embodiment

The first embodiment of this technology will be described with reference to FIGS. 1 to 5. In this section, a television device 10TV (an example of a liquid crystal display device 10) including a lighting unit 12 (a backlight unit) will be described. An X-axis, a Y-axis, and a Z-axis are present in some drawings for the purpose of illustration.

Figure 1:
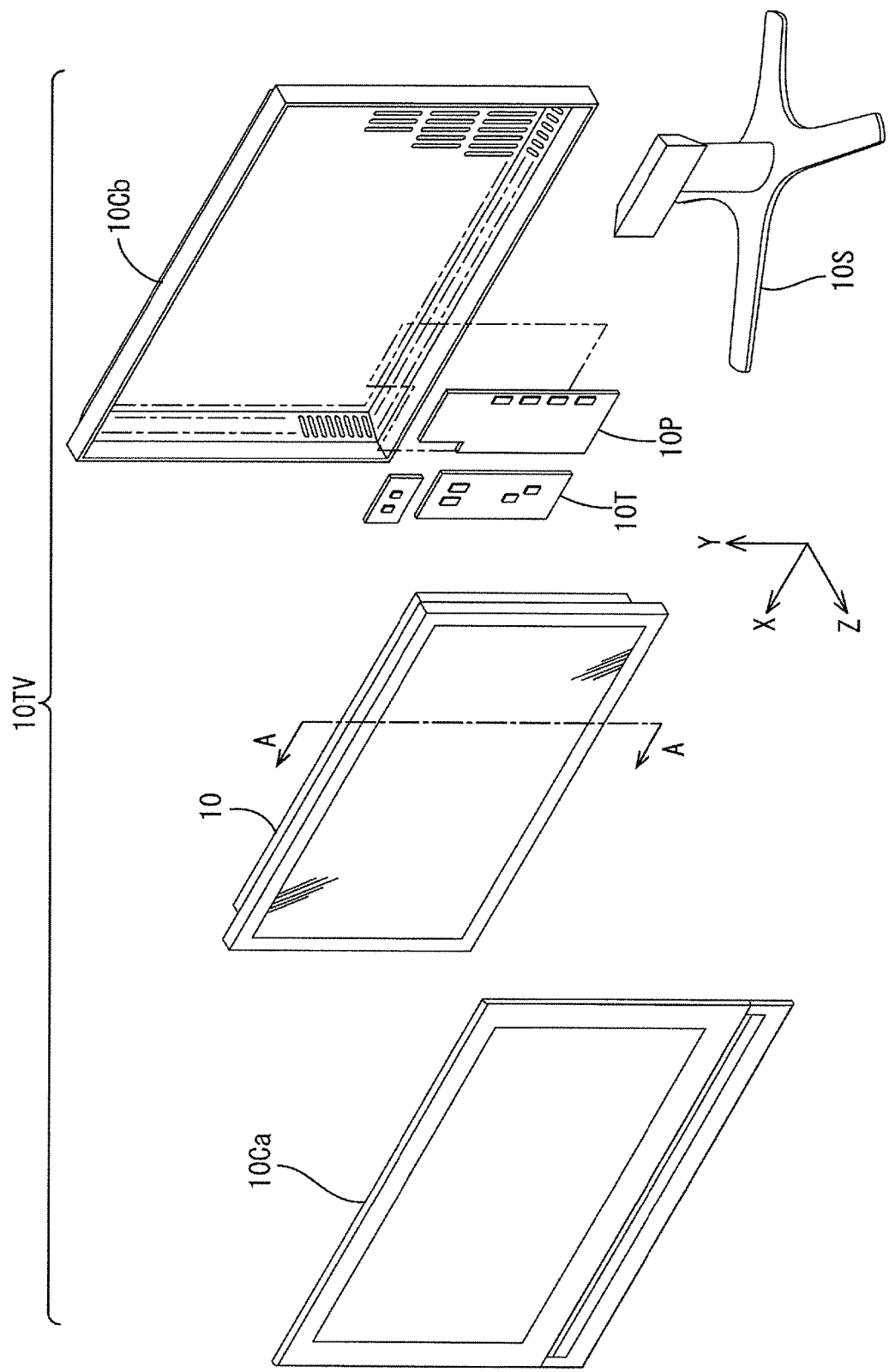
FIG. 1 is an exploded perspective view illustrating a general configuration of a television device according to a first embodiment of the present invention.
Figure 2:
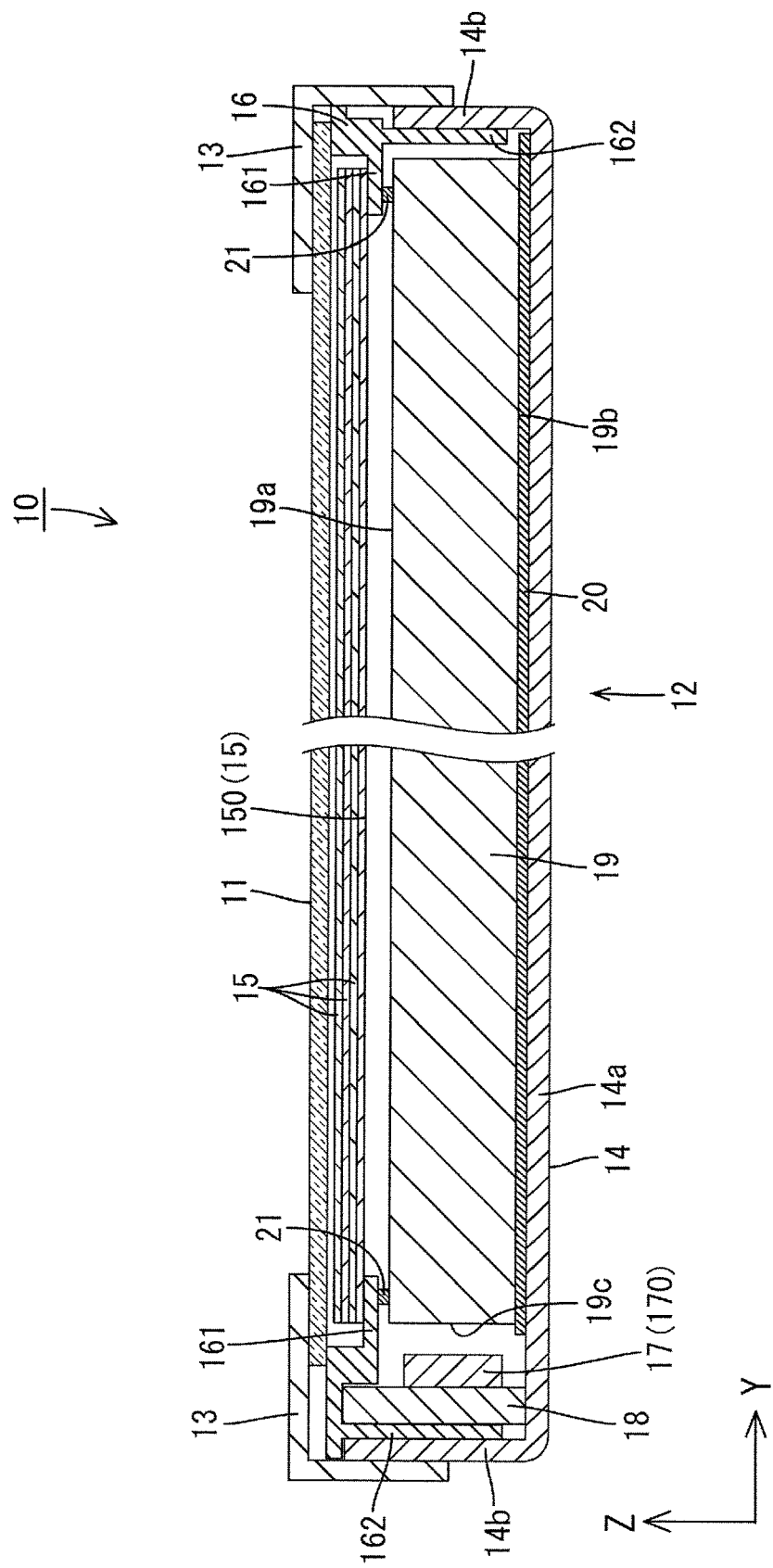
FIG. 2 is a cross-sectional view along line A-A in FIG. 1.

The television device 10TV and the liquid crystal display device 10 will be described. FIG. 1 an exploded perspective view illustrating a schematic configuration of the television device 10TV. FIG. 2 is a cross-sectional view along line A-A in FIG. 1.

As illustrated in FIG. 1, the television device 10TV includes the liquid crystal display device 10 (an example of a display device), a front cabinet 10Ca, a rear cabinet 10Cb, a power supply 10P, a tuner 10T (a receiver), and a stand 10S.

The liquid crystal display device 10 in this embodiment has a horizontally-long rectangular overall shape elongated in the horizontal direction. As illustrated in FIG. 2, the liquid crystal display device 10 mainly includes a liquid crystal panel 11, the lighting unit 12 (the backlight unit), and a bezel 13. The liquid crystal panel 11 is used as a display panel. The lighting unit 12 is an external light source configured to supply light to the liquid crystal panel 11. The bezel 13 has a frame shape and holds the liquid crystal panel 11 and the lighting unit 12.

The liquid crystal panel 11 includes a pair of transparent boards and a liquid crystal layer sealed between the substrates. The liquid crystal panel 11 is configured to display an image to be visible on a panel surface using the light emitted by the lighting unit 12. The liquid crystal panel 11 has a horizontally-long rectangular shape in a plan view. One of the boards of the liquid crystal panel 11 is an array board including a transparent glass substrate, thin film transistors (TFTs) which are switching components, and pixel electrodes. The TFTs and the pixel electrodes are arranged in a matrix on the substrate. The other board is a color filter (CF) board including a transparent glass substrate and color filters. The color filters include red, green, and blue color filters arranged in a matrix on the glass substrate.

The lighting unit 12 is a device disposed behind the liquid crystal panel 11 for supplying light to the liquid crystal panel 11. The lighting unit 12 is configured to emit white light rays. In this embodiment, the lighting unit 12 is an edge light type (or a side light type) lighting device.

As illustrated in FIG. 2, the lighting unit 12 includes a chassis 14, an optical member 15, a frame 16, LEDs 17, an LED board 18, a light guide plate 19, and a reflection sheet 20.

The chassis 14 has a box-like overall shape. The chassis 14 is formed from a metal sheet such as an aluminum sheet and an electro galvanized steel sheet (SECC). The chassis 14 includes a bottom plate 14a and sidewall plates 14b. The bottom plate 14a has a rectangular shape similar to the liquid crystal panel in the plan view. The sidewall plates 14b rise from edges of the bottom plate 14a and surround the bottom plate 14a.

The chassis 14 holds various kinds of components including the LEDs 17, the LED board 18, a reflection sheet 20, the light guide plate 19, and the optical member 15. Circuit boards including a control board and an LED driver board, which are not illustrated, are attached to an external surface of the chassis 14.

The reflection sheet 20 is placed to cover a surface of the bottom plate 14a inside the chassis 14. The reflection sheet 20 (an example of a reflecting member) is a sheet shaped member having light reflectivity. The reflection sheet 20 may be made of white foamed polyethylene terephthalate (an example of a white plastic sheet). The light guide plate 19 is place on the reflection sheet 20 and held in the chassis 14.

The light guide plate 19 is made of transparent synthetic resin having high light transmissivity and a refraction index sufficiently higher than that of air (e.g., acrylic resin such as PMMA, polycarbonate resin). The light guide plate 19 is a plate shaped member having a rectangular shape similar to the liquid crystal panel in the plan view. The light guide plate 19 is held in the chassis 14 such that a front surface 19a thereof is opposed to the liquid crystal panel 11 and a back surface 19b thereof are opposed to the reflection sheet 20.

The front surface 19a of the light guide plate 19 is configured as a light exiting surface 19a through which light rays exit toward the liquid crystal panel 11.

The optical member 15 is supported by the frame 16 between the light exiting surface 19a and the liquid crystal panel 11. A first long end surface 19c of the light guide plate 19 is configured as a light entering surface 19c through which light rays from LEDs 17 enter.

A second long end surface 19d and two short end surfaces 19e and 19f of the light guide plate 19 are not opposed to the LEDs 17 and the light source (the LEDs 17). Therefore, second long end surface 19d and two short end surfaces 19e and 19f may be referred to as light source non-opposed surfaces. Especially, the light source non-opposed surface on a side opposite from the light entering surface 19c (the second long end surface 19d) may be referred to as "an opposite-side light source non-opposed surface."

The frame 16 has a frame shape (a picture frame shape) as a whole to cover a peripheral portion of the light guide plate 19 from the front side. The frame 16 is fitted in an opening of the chassis 14. The frame 16 is made of synthetic resin and painted in white to have light reflectivity. The frame 16 includes a frame body 161 and projected walls 162. The frame body 161 has a frame shape in the plan view. The frame body 161 includes an inner edge portion held against the peripheral portion of the light guide plate 19 in the chassis 14 from the front side. The projected walls 162 project from the frame body 161 toward the bottom plate 14a of the chassis 14. The projected walls 162 are held in the chassis 14.

The frame body 161 has the frame shape such that the inner edge portion overlaps the peripheral portion of the light guide plate 19 and an outer edge portion overlaps upper ends of the sidewall plates 14b of the chassis 14. An elastic member 21 made of urethane foam is attached to a back surface of the inner edge portion of the frame body 161. The elastic member 21 in this embodiment is in black and has a light blocking property. The elastic member 21 has a frame shape (or a ring shape) as a whole. The elastic member 21 is brought into contact with the peripheral portion of the light guide plate 19 from the front side.

The inner edge portion of the frame body 161 is configured such that the front surface thereof is one step lower than the front surface of the outer edge portion portion. An edge portion of the optical member 15 is placed on the surface that is one step lower. The front surface of the inner end of the frame portion includes protrusions that are not illustrated. The edge portion of the optical member 15 includes holes in which the protrusions are fitted and the optical member 15 is supported by the frame body 161.

Each projected wall 162 has a plate shape that extends from the outer edge portion of the frame body 161 toward the bottom plate 14a of the chassis 14 to be opposed to the end surface 19c of the light guide plate 19. The LED board 18 on which the LEDs 17 are mounted are attached to a portion of the projected wall 162 opposed to the first long end surface 19c of the light guide plate 19. A portion of the projected wall 162 other than the portion to which the LED board 18 is attached is placed between the end surface of the light guide plate 19 and the sidewall plate 14b and held in the chassis 14.

The optical member 15 has a horizontally-long rectangular shape in a plan view similar to the liquid crystal panel 11. The edge portion of the optical member 15 is disposed between the light exiting surface 19a of the light guide plate 19 and the back surface of the liquid crystal panel 11 with the edge portion placed on the frame body 161 of the frame 16 from the front side. The optical member 15 has a function for exerting predefined optical effects on the light rays exiting from the light guide plate 19 and directs the light rays toward the liquid crystal panel 11. The optical member 15 includes multiple sheets that are placed in layers (optical sheets).

The sheets of the optical member 15 (the optical sheets) may be a diffuser sheet, a lens sheet, and a reflective type polarizing sheet. The optical member 15 in this embodiment includes a phosphor sheet 150 containing quantum dot phosphors (an example of a wavelength converting member) as a mandatory member (optical sheet). The phosphor sheet 150 is disposed the closest to the light exiting surface 19a among the sheets of the optical member 15.

The phosphor sheet 150 will be described. The phosphor sheet 150 has a rectangular shape similar to the liquid crystal panel 11 in the plan view. The phosphor sheet 150 passes some of the light rays from the LEDs 17 in the thickness direction thereof. The phosphor sheet 150 absorbs some of the light rays from the LEDs 17, converts the light rays into light rays in a different wavelength range, and releases the light rays. The phosphor sheet 150 includes a wavelength converting layer, a pair of supporting layers, and a pair of barrier layers. The supporting layers sandwich the wavelength converting layer. The barrier layers are formed on outer sides of the supporting layers to sandwich the wavelength converting layer and the supporting layers. Planar light exits from the phosphor sheet 150 toward the liquid crystal panel 11.

The wavelength converting layer contains an acrylic resin as a binder resin and the quantum dot phosphors (an example of first phosphors) dispersed in the acrylic resin. The acrylic resin is transparent and has light transmissivity. The acrylic resin has adhesiveness to the supporting layers. The supporting layers are sheet (or film) members made of polyester based resin such as polyethylene terephthalate (PET).

The quantum dot phosphors are phosphors having high quantum efficiency. The quantum dot phosphors include semiconductor nanocrystals (e.g., diameters in a range from 2 nm to 10 nm) which tightly confine electrons, electron holes, or excitons with respect to all direction of a three dimensional space to have discrete energy levels. A peak wavelength of emitting light rays (a color of emitting light rays) is freely selectable by changing the dot size.

In this embodiment, the wavelength converting layer includes green quantum dot phosphors and red quantum dot phosphors as quantum dot phosphors. The green quantum dot phosphors emit green light (in a wavelength range from about 500 nm to about 570 nm). The red quantum dot phosphors emit red light rays (in a wavelength range from about 600 nm to about 780 nm). An emitting light spectrum of the green light rays emitted by the green quantum dot phosphors and an emitting light spectrum of the red light rays emitted by the red quantum dot phosphors have sharp peaks, respectively. A half width of each peak is small, that is, purity of green and purity of red are very high and their color gamut is large.

The green quantum dot phosphors absorb the light rays from the LEDs 17 (the blue light rays, the primary light rays, exciting light rays). The green quantum dot phosphors are excited by the light rays and emit green light rays (in the wavelength range from about 500 nm to 570 nm). Namely, the green quantum dot phosphors have functions for converting the light rays from the LEDs 17 (the blue light rays, the primary light rays, the exciting light rays) to light rays in the different wavelength range (the green light rays).

The red quantum dot phosphors absorb the light rays from the LEDs 17 (the blue light rays, the primary light rays, exciting light rays). The red quantum dot phosphors are excited by the light rays and emit red light rays (in the wavelength range from about 600 nm to 780 nm). Namely, the red quantum dot phosphors have functions for converting the light rays from the LEDs 17 (the blue light rays, the primary light rays, the exciting light rays) to light rays in the different wavelength range (the red light rays).

Materials used for the quantum dot phosphors include a material prepared by combining elements that could be divalent cations such as Zn, Cd, and Pb and elements that could be divalent anions such as O, S, Se, and Te (e.g., cadmium selenide (CdCe), zinc sulfide (ZnS), a material prepared by combining elements that could be trivalent cations such as Ga and In and elements that could be trivalent anions such as P, As, and Sb (e.g., indium phosphide (InP), gallium arsenide (GaAs), and chalcopyrite type compounds (CuInSe2). In this embodiment, CdSe is used for the material of the quantum dot phosphors.

In this embodiment, the quantum dot phosphors (the green quantum dot phosphors and the red quantum dot phosphors) are evenly dispersed in the acrylic resin in the wavelength converting layer. The wavelength converting layer may contain other components such as a scattering agent.

The barrier layers are formed from metal oxide films such as alumina films and silicon oxide films. The barrier layers have functions for protecting the quantum dot phosphors in the wavelength converting layer from moisture (water) and oxygen. The barrier layers may be formed on the supporting layers by a vacuum deposition method.

The LEDs 17 are provided as a light source for applying light to the light entering surface 19c of the light guide plate 19. The LEDs 17 are so-called top surface light emitting type LEDs and multiple LEDs 17 are provided. The LEDs 17 are arranged at intervals in a line and mounted on the LED board 18. In this specification, the line of the LEDs 17 may be referred to as an LED line 170 (an example of a light source line).

Figure 3:
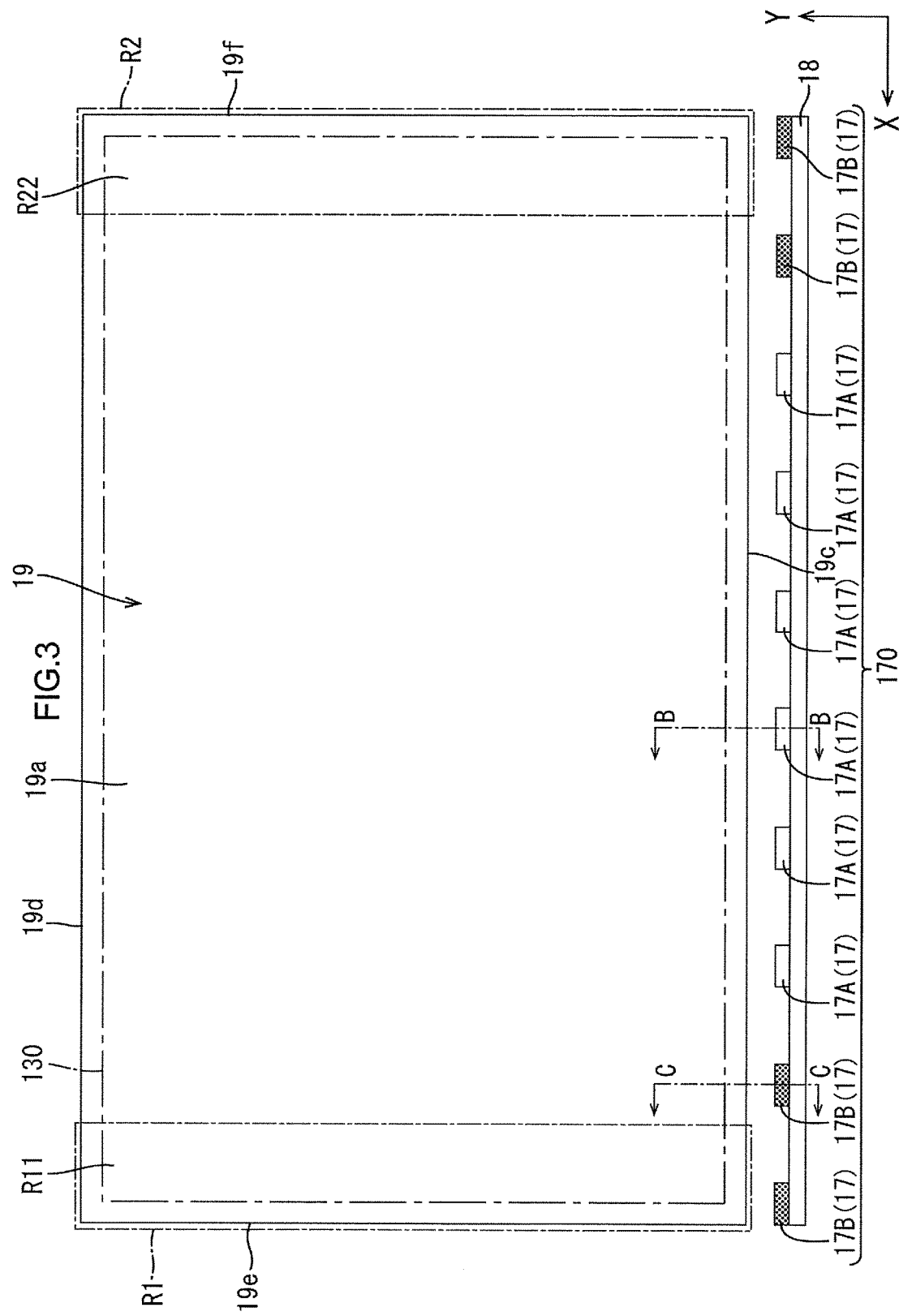
FIG. 3 is a plan view schematically illustrating a positional relationship between an LED line and a light guide plate viewed from a front side.

FIG. 3 is a plan view schematically illustrating a positional relationship between the LED line 170 and the light guide plate 19 viewed from the front side. As illustrated in FIG. 3, the LEDs 17 in the LED line 170 are arranged along the light entering surface 19c (a long end surface) of the light guide plate 19. In this embodiment, the LEDs 17 are arranged at equal intervals.

The LEDs 17 include two types of LEDs configured to emit different colors of light rays. Specifically, the LEDs 17 include LEDs 17A configured to emit blue light rays and LEDs 17B configured to emit white light rays.

Each LED 17A includes a blue LED component (a blue light emitting component), a transparent sealing member, and a case. The LED component is a light emitting source in a form of a chip. The sealing member seals the blue LED component. The case has a box shape and holds the blue LED component and the sealing member. The LEDs 17A are configured to emit blue light rays. Each blue LED component is a semiconductor containing InGaN. When a forward voltage is applied, the blue LED component emits light rays in a blue wavelength range (about 420 nm to about 500 nm), that is, blue light rays. In this specification, the blue light rays emitted by the LEDs 17 including the LEDs 17A may be referred to as primary light rays.

Figure 4:
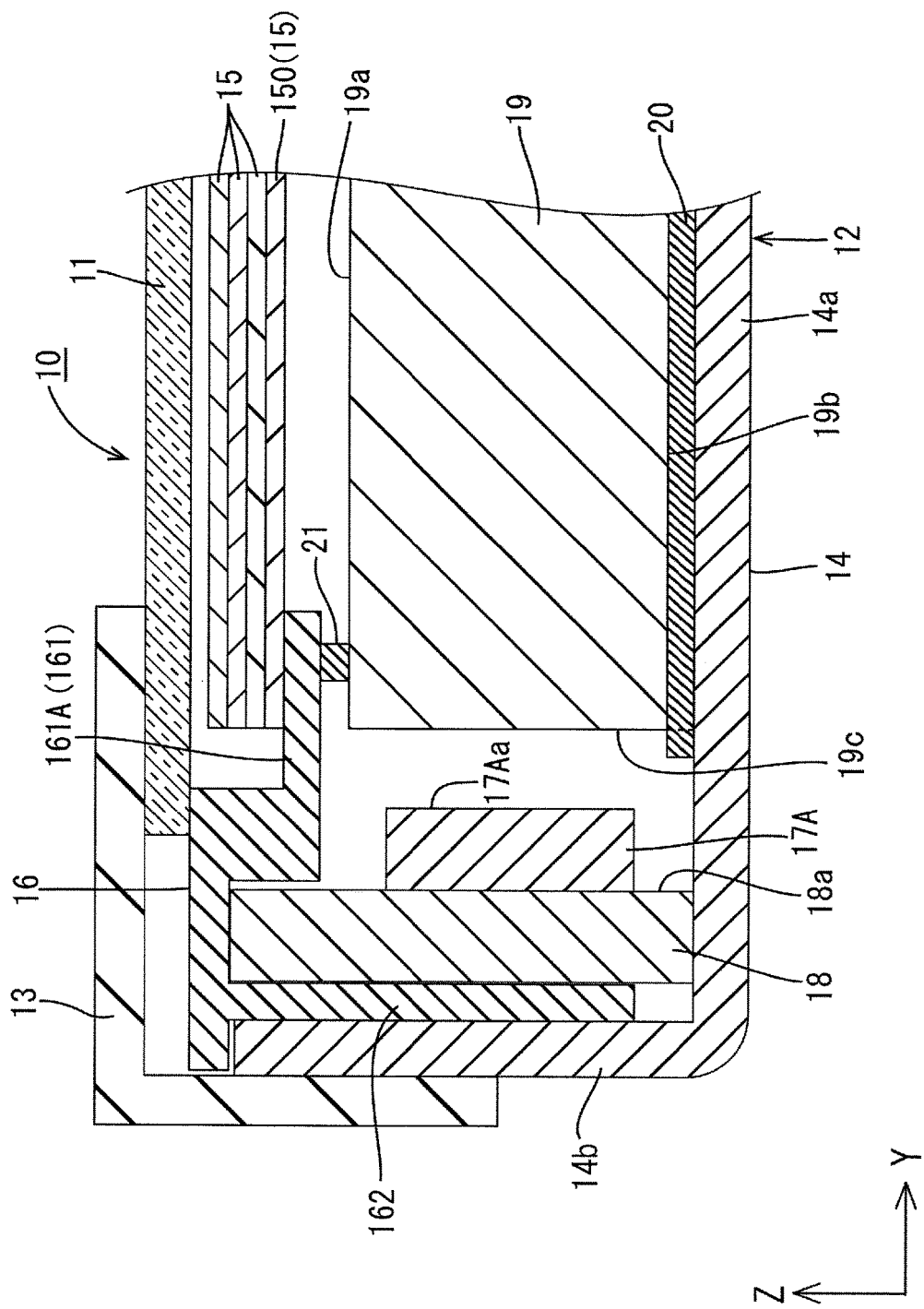
FIG. 4 is a magnified cross-sectional view illustrating a portion of a liquid crystal display device including an inner light source and therearound.

As illustrated in FIG. 3, the LEDs 17A are arranged in line in the middle of the LEDs line 170. In this specification, the LEDs 17A configured to emit the blue light and arranged in the middle of the LED line 170 may be referred to as "inner light sources." FIG. 4 is a magnified cross-sectional view of a portion of the liquid crystal display device 10 including the inner light sources 17A and therearound. FIG. 4 is a cross-sectional view along line B-B in FIG. 3. As illustrated in FIG. 4, the LEDs 17A provided as the inner light sources include light emitting surfaces 17Aa (light exiting portions). The LEDs 17A are mounted on a mounting surface 18a of the LED board 18 having a flat plate shape to be opposed to the light entering surface 19c of the light guide plate 19.

The LEDs 17B are configured to emit blue light rays and light rays that exhibit yellow that makes a complementary color pair with blue (i.e., blue light rays). Because the LEDs 17B emit the blue light rays and the yellow light rays (an example of complementary color light rays), white exiting light is provided. The LEDs 17B in this embodiment includes bodies 71 (an example of a reference light source) and wavelength converting members 72. Each body 71 is an LED that has the same configuration as that of the LED 17A. Each wavelength converting member 72 is yellow in color and formed on a surface of the body 71 (including a light emitting surface 17Aa (a light exiting portion)) to cover the surface. The wavelength converting member 72 is a film containing a transparent binder rein and yellow phosphors (an example of second phosphors) which are dispersed in the binder resin. The binder resin may be made of acrylic resin. The phosphors contained in the wavelength converting member 72 may be green phosphors (an example of second green phosphors) made of $SrGa_2S_4:Eu^{2+}$ and red phosphors (an example of second red phosphors) made of $(Ca, Sr, Ba)S:Eu^{2+}$.

Blue light rays (wavelength range: about 420 nm to about 500 nm), which are primary light rays, exit from the body 71 of the LED 17B (the reference light source), similar to the LEDs 17A. Some of the blue light rays exiting from the bodies 71 are converted to yellow light rays (the complementary light rays) by the phosphors in the wavelength converting member 72. Other blue light rays pass through the wavelength converting member 72 without wavelength conversion.

The green phosphors in the wavelength converting member 72 absorb the blue light rays (the primary light rays) from the bodies 71. The green phosphors are excited by the blue light rays and emit green light rays (in a wavelength range from about 500 nm to about 570 nm). The red phosphors in the wavelength converting member 72 absorb the blue light rays (the primary light rays) from the bodies 71. The red phosphors are excited by the blue light rays and emit red light rays (in a wavelength range from about 600 nm to about 780 nm). Namely, the wavelength converting member 72 absorbs the blue light rays from the bodies 71 and emits yellow light rays that are mixture of the green light rays and the red light rays.

From the blue light rays and the yellow light rays emitted by the LEDs 17B, white light rays that are mixture of the blue light rays and the yellow light rays.

As illustrated in FIG. 3, two LEDs 17B are disposed at either end of the LED line 170. In this specification, the LEDs 17B configured to emit the white light rays may be referred to as "outer light sources." FIG. 5 is a magnified cross-sectional view of a portion of the liquid crystal display device 10 including the end light source 17B and therearound. FIG. 5 is the cross-sectional view along line C-C in FIG. 3. As illustrated in FIG. 5, the LED 17B, which is the outer light source, is mounted on the mounting surface 18a of the LED board 18 having the flat plate shape such that the light emitting surface 17Ba is opposed to the light entering surface 19c of the light guide plate 19.

As illustrated in FIG. 3, the LED board 18 has an elongated shape that extends along a longitudinal direction of the light guide plate 19. The LED board 18 on which the LEDs 17 are mounted is attached to the projected wall 162 of the frame 16 and held in the chassis 14.

FIG. 6 is a plan view that schematically illustrates a positional relationship between the LED line 170 and the light guide plate 19 viewed from the rear side. As illustrated in FIG. 6, a light reflecting and scattering pattern 22 including dots 22a having light reflectivity and light scattering properties are formed on the back surface 19b of the light guide plate 19. The dots 22a are white films formed in round shapes on the back surface 19b of the light guide plate 19 by a known method such as printing. The dots 22a of the light reflecting and scattering pattern 22 closer to the LEDs 17 (i.e., closer to the light entering surface 19c) are formed smaller in size and at a lower density (per unit area). The size and the density of the dots 22a (per unit area) increase as a distance from the LEDs 17 increase. When the light rays entering the light guide plate 19 through the light entering surface 19c reach the dots 22a, the light rays are reflected or scattered by the dots 22a and exit through the light exiting surface 19a.

In such a lighting unit 12, when the power is supplied to the LEDs 17 in the LED line 170, the LEDs 17 are turned on and the light rays emitted by the LEDs 17 enter the light guide plate 19 through the light entering surface 19c.

The LEDs 17A among the LEDs 17 provided as the inner light sources emit the blue light rays as described earlier. The LEDs 17B provided as the outer light sources emit the white light rays as described earlier.

The light rays that have entered the light guide plate 19 travel through the light guide plate 19. The light rays are repeatedly reflected while traveling through the light guide plate 19. The light rays that reach the light reflecting and scattering pattern (the dots 22a) on the back surface 19b during the traveling through the light guide plate 19 are directed toward the light exiting surface 19a. The light rays are directed to the phosphor sheet 150 via the light exiting surface 19a.

As described earlier, some of the blue light rays pass through the phosphor sheet 150 without the wavelength convertion. Other blue light rays are converted to the yellow light rays and released. The light rays exiting from the phosphor sheet 150 (the blue light rays, the yellow light rays) may be retroreflected for several times by hitting other optical member 15 (optical sheet) laid over the phosphor sheet 150 or the reflection sheet 20 on the back surface 19b side of the light guide plate 19. The light rays passing through the phosphor sheet for several times exit from the optical members 15 and travel toward the back surface of the liquid crystal panel 11.

FIG. 3 illustrates the light guide plate 19 viewed from the light exiting surface 19a side. The light rays exiting from regions R1 and R2 of the light exiting surface 19a closer to the short end surfaces 19e and 19f adjacent to the light entering surface 19c are retroreflected for the smaller number of times in comparison to the light rays exiting from the center region of the light exiting surface 19a.

The light rays reaching the center region of the light exiting surface 19a are mainly emitted by the LEDs 17A that are provided as the inner light sources. The light rays reaching the regions R1 and R2 on the left and the light side of the light exiting surface 19a are emitted by the LEDs 17B provided as the outer light sources. Although the light rays emitted by the LEDs 17 spread out in a certain angle range, the light rays are more likely to travel straightforward. Therefore, the light rays emitted by the LEDs 17A that are provided as the inner light sources are less likely to reach the edge portions of the light guide plate 19 (on the light source non-opposed surface 19e side and the light source non-opposed surface 19f side adjacent to the light entering surface 19c).

In FIG. 3, a line 130 (a chain line) drawing a rectangle along edges of the light exiting surface 19a indicates inner edges of the frame 16 (inner edges of the frame body 161). Some of the light rays exiting the light guide plate 19 through the light exiting surface 19a and actually reaching the liquid crystal panel 11 (i.e., the light rays exiting from the lighting unit 12) pass through the region inside the inner edges of the frame 16. When the light exiting side of the lighting unit 12 is viewed in plan, a region R11 surrounded by the line 130 and the region R1 and a region R22 surrounded by the line 130 and the region R2 are the regions from which the light rays that are retroreflected for the smaller number of times in comparison to the light rays exiting from the center region exit.

If the light rays reaching the region from which the light rays that are retroreflected for the smaller number of time exit are the light rays from the light source configured to emit only blue light rays (the LEDs 17A), that is, configured the same as the inner light sources (the LEDs 17A), light exiting from the regions R11 and R22 includes higher percentage of the blue light rays in comparison to light exiting from the center region. In such a case, the edge portions of the display surface of the liquid crystal panel 11 (corresponding to the regions R11 and R22) are more bluish than the center portion of the display surface.

In the lighting unit 12 in this embodiment, the LEDs 17B that are configured to emit the white light rays are arranged on either end of the LED line 170 including the LEDs 17. Therefore, even though the light rays are retroreflected for the smaller number of times in the regions R11 and R22 (R1 and R2) of the light exiting surface 19a, the light includes the higher percentage of the light rays in color yellow that makes a complementary color pair with blue and the lower percentage of the blue light rays. The whitish light exits from either edge portion of the lighting unit 12 similar to the center portion. Namely, the planar light exiting from the lighting unit 12 is less likely to be tinted a color of the primary light rays (blue) emitted by the LEDs 17A more in the edge portions than the center portion.

Depending on a condition of the light reflecting and scattering pattern 22 formed on the back surface 19b of the light guide plate 19, the percentage of the blue light rays in the light exiting from the region closer to the long end surface 19d (the opposite-side light source non-opposed surface) on the side opposite from the light entering surface 19c may be higher in comparison to the light exiting from the center region. The bluish light in the region closer to the long end surface 19d (the opposite-side light source non-opposed surface) exist in a significantly small region in comparison to the bluish light in either edge portion of the light guide plate 19 (on the light source non-opposed surface 19e side and the light source non-opposed surface 19f side adjacent to the light entering surface 19c). Furthermore, such bluish light is not practically a problem in viewing an image displayed on the liquid crystal panel 11.

Depending on a condition of the light reflecting and scattering pattern 22, the light including the higher percentage of the blue light rays may exit from a region of the light exiting surface 19a closer to the light entering surface 19c in comparison to the light exiting from the center region. However, bluish light in the region closer to the light entering surface 19c exists in a small region and thus is not practically a problem in viewing an image displayed on the liquid crystal panel 11.

In this embodiment, the same type of the LEDs are used for the bodies 71 (the reference light sources) of the LEDs 17B provided as the outer light sources and the LEDs 17A provided as the inner light sources. Namely, in the lighting unit 12 in this embodiment, common parts can be used for the bodies 71 (the reference light sources) of the outer light sources and the LEDs 17A provided as the inner light sources. Therefore, high productivity can be achieved and on-off control of the LEDs 17 can be easily performed.

In this embodiment, the bodies 71 (the reference light sources) and the wavelength converting members 72 that are the films are used for the LEDs 17B. By adjusting a thickness of the films formed on the bodies 71 (the reference light sources) or the content of the phosphors, the wavelength converting functions of the wavelength converting members 72 can be easily adjusted.

Second Embodiment

Next, a second embodiment according to the present invention will be described with reference to FIG. 7. In this section, a lighting unit including an LED line 170A that replaces the LED line 170 in the first embodiment. Other than that, a basic configuration of the lighting unit in this embodiment is similar to that of the first embodiment. Components similar to those of the first embodiment will be indicated by the same symbols as those indicating the components of the first embodiment and will not be described in detail.

FIG. 7 is a plan view that schematically illustrates a positional relationship between the LED line 170 and the light guide plate 19 in the lighting unit in the second embodiment. Similar to the first embodiment, the LED line 170A in this embodiment includes the LEDs 17 arranged in line and mounted on the LED board 18. Similar to the first embodiment, the LEDs 17A that are the inner light sources configured to emit blue light rays are in the middle portion of the LED line 170A. Two LEDs 17B1 and two LEDs 17B that are outer light sources are at ends of the LED line 170A.

As illustrated in FIG. 7, the outer light sources closer to the inner light sources are the LEDs 17B1 and the outer light sources farther from the inner light sources (the outermost LEDs in the LED line 170A) are the LEDs 17B2. The outer light sources (the LEDs 17B1, the LEDs 17B2) in this embodiment include bodies (reference light sources) and wavelength converting members, similar to the first embodiment. The each body is an LED that is the same type of LED as the LED 17A of the inner light sources. Each wavelength converting member covers a surface of the corresponding body. The LEDs 17B1 and the LEDs 17B2 are configured to emit whitish light rays.

In this embodiment, the LEDs 17B1 and the LEDs 17B2 arranged in line are configured such that the light rays emitted therefrom become more whitish from the middle of the LED line 170A toward the ends of the LED line 170A. Namely, light from the LEDs 17B2 include a higher percentage of yellow light rays (complementary color light rays) and thus look more whitish in comparison to light from the LED 17B1.

The bodies (the reference light sources) of the LEDs 17B1 and the LED 17B2 are the same type, that is, configured to emit light primary light rays. However, the content of the yellow phosphors (the second phosphors) (the content of the second green phosphors and the content of the second red phosphors) in the wavelength converting members formed on the bodies of the LEDs 17B2 (the reference light sources) is higher in comparison to the wavelength converting members formed on the bodies (the reference light sources) of the LEDs 17B1. Namely, the wavelength converting efficiency of the LEDs 17B2 by the wavelength converting members is higher than that of the LEDs 17B1.

The percentage of the blue light rays included in the white light from the LEDs 17B1 is higher than that of the white light from the LEDs 17B2. The percentage of the yellow light rays (the green light rays, the red light rays) in the light from the LEDs 17B2 is higher.

With the LEDs 17 (the LEDs 17B1, the LEDs 17B2) of the outer light sources arranged in line and configured to emit the light rays that become more whitish from the middle of the LED line 170A toward the ends of the LED line 170A, the light exiting from the lighting unit is less likely to be tinted a color of the primary light rays from the LEDs 17A (blue) in the edge portion of the lighting unit than in the center portion of the lighting unit.

As in this embodiment, by adjusting the whitish color of the light rays from the LEDs 17B1 and 17B2 of the outer light sources, a boundary in the exiting light from the lighting unit are less likely to be recognized between the center portion and the edge portion.

Other Embodiments

The present invention is not limited to the above embodiments described in the above sections and the drawings. For example, the following embodiments may be included in technical scopes of the technology.

(1) In each of the above embodiments, one of the long end surfaces among the end surfaces of the light guide plate is configured as the light entering surface. The present invention is not limited to such a configuration. For example, two long end surfaces may be configured as light entering surfaces. Alternatively, one of two short end surfaces may be configured as light entering surfaces.

(2) In each of the above embodiments, two LEDs arranged in line are provided as the outer light sources. The present invention is not limited to such a configuration. For example, one outer light source may be provided on either side of the inner light sources. Alternatively, two or more outer light sources may be provided.

(3) In each of the above embodiments, the outer light sources configured to emit white light rays include the bodies (the reference light sources) configured to emit the blue primary light rays and the wavelength converting members, which are the films, formed on the bodies. However, the present invention is not limited to such a configuration. For example, standard white LEDs configured to emit white light rays may be used. Furthermore, the phosphors contained in the wavelength converting members are not limited to those in the first embodiment. Other types of phosphors may be used.

(4) In each of the above embodiments, the LEDs configured to emit light rays in a single color of blue are used for the light sources configured to emit the primary light rays (the LEDs 17A). However, LEDs configured to emit light in a color other than blue may be used as a light source. In such a case, the color of the wavelength converting members included in the outer light sources may be altered according to the color of the light from the LEDs. For example, LEDs configured to emit magenta primary light rays and wavelength converting members including green surfaces may be used for the outer light sources. In this case, green phosphors may be contained in the wavelength converting members. In this case, if green phosphors are contained in a phosphor sheet (a wavelength converting member), a lighting unit emits white light.

(5) Other than the above (4), LEDs configured to emit violet primary light rays and wavelength converting members including chartreuse surfaces may be used for the outer light sources. In this case, yellow phosphors and green phosphors with a predefined ratio may be contained in wavelength converting members. In this case, if the yellow phosphors and the green phosphors are contained in a phosphor sheet (a wavelength converting member) with a predefined ratio, a lighting unit emits white light.

(6) Other than the above (4) or (5), LEDs configured to emit cyan primary light rays and wavelength converting members including red surfaces may be used for the outer light sources. In this case, red phosphors may be contained in the wavelength converting members. In this case, if the red phosphors are contained in a phosphor sheet (a wavelength converting member), a lighting unit emits white light.

(7) The kinds and the sequence of the layers of the optical members (the optical sheets) may be altered as appropriate.

(8) The kinds and the sequence of the layers of the phosphor sheet (the wavelength converting member) may be altered as appropriate.

(9) The quantum dot phosphors contained in the phosphor sheet (the wavelength converting member) may be the core-shell type phosphors or core type quantum dot phosphors each having a single internal composition may be used.

(10) In each of the above embodiments, the quantum dot phosphors are contained in the phosphor sheet (a wavelength converting member). However, other type of phosphors may be contained in the phosphor sheet (the wavelength converting member). For example, sulfide phosphors may be contained in the optical sheet (the wavelength converting member). Specifically, $SrGa_2S_4:Eu^{2+}$ may be used for the green phosphors and $(Ca, Sr, Ba)S:Eu^{2+}$ may be used for the red phosphors.

(11) Other than the above (10), $(Ca, Sr, Ba)_3SiO_4:Eu^{2+}$, $\beta$-SiAlON:$Eu^{2+}$, or $Ca_3Sc_2Si_3O_{12}:Ce^{3+}$ may be used for the green phosphors contained in the phosphor sheet (the wavelength converting member). $(Ca, Sr, Ba)_2SiO_5N_8:Eu^{2+}$ or $CaAlSiN_3:Eu^{2+}$ may be used for the red phosphors contained in the phosphor sheet (the wavelength converting member). $(Y, Gd)_3 (Al, Ga)_5O_{12}:Ce^{3+}$ (so-called YAG: $Ce^{3+}$), $\alpha$-SiAlON:$Eu^{2+}$, or $(Ca, Sr, Br)_3SiO_4:Eu^{2+}$ may be used for the yellow phosphors contained in the phosphor sheet (the wavelength converting member). Other than the above, a complex fluoride fluorescent material (e.g., manganese-activated potassium fluorosilicate ($K_2TiF_6$)) may be used for the phosphors contained in the phosphor sheet (the wavelength converting member).

(12) Other than the above (10) and (11), organic phosphors may be used for the phosphors contained in the phosphor sheet (the wavelength converting member). The organic phosphors may be low molecular organic phosphors including triazole or oxadiazole as a basic skeleton.

(13) Other than the above (10), (11), and (12), phosphors configured to convert wavelengths through energy transfer via dressed photons (near-field light) may be used for the phosphors contained in the phosphor sheet (the wavelength converting member). Preferable phosphors of this kind may be phosphors including zinc oxide quantum dots (ZnO-QD) with diameters from 3 nm to 5 nm (preferably about 4 nm) and DCM pigments dispersed in the zinc oxide quantum dots.

(14) Other than the above embodiments, the emission spectrum of the LEDs (peak wavelengths, half width of each peak) and the emission spectrum of the phosphors contained in the phosphor layer (peak wavelengths, half width of each peak) may be altered as appropriate.

(15) In each of the above embodiments, InGaN is used for the material of the LED components in the LEDs. However, GaN, AlGaN, GaF, ZnSe, ZnO, or AlGaInP may be used for the material of the LED components.

(16) In each of the above embodiments, the chassis 14 is made of metal. However, a chassis made of resin may be used.

(17) In each of the above embodiments, the LEDs are used for the light sources. However, other types of light sources such as organic ELs may be used.

(18) In each of the above embodiments, the liquid crystal panel and the chassis are in the upright position with the short-side directions corresponding with the vertical direction. However, the liquid crystal panel and the chassis may be in the upright portion with the long-side directions corresponding with the vertical direction.

(19) In each of the above embodiments, the TFTs are used for the switching components of the liquid crystal display device. However, the present invention can be applied to a liquid crystal display device including switching components other than the TFTs (e.g., thin film diodes (TFD)). Furthermore, the present invention can be applied to a black-and-white liquid crystal display other than the color liquid crystal display.

(20) In each of the above embodiments, the transmissive type liquid crystal display device is provided. However, the present invention can be applied to a reflective type liquid crystal display device or a semitransmissive type liquid crystal display device.

(21) In each of the above embodiments, the liquid crystal display device including the liquid crystal panel as a display panel is provided. However, the present invention can be applied to display devices including other types of display panels.

(22) In each of the above embodiments, the television device including the tuner is provided is provided. However, the present invention can be applied to a display device without a tuner. Specifically, the present invention can be applied to a liquid crystal display panel used in an digital signage or an electronic blackboard.

(23) In each of the above embodiments, the lighting unit is configured to emit the white planar light. However, the present invention is not limited to such a configuration. For example, the lighting unit may be configured to emit planar light tinted a warm color such as red and orange or another color.

EXPLANATION OF SYMBOLS

10: Liquid crystal display device (display device)
12: Lighting unit (backlight unit)
13: Bezel
14: Chassis 15: Optical member
150: Phosphor sheet (wavelength converting member)
16: Frame
17: LED (light source)
17A: Inner light source
17B: Outer light source
170: LED line (light source line)
18: LED board
19: Light guide plate
19a: Light exiting surface
19b: Back surface
19c: Light entering surface
20: Reflection sheet
21: Elastic member
22: Light reflecting and scattering pattern

The invention claimed is:

1. A lighting device comprising:
    a light guide plate in a rectangular shape including a light entering surface that is one of side surfaces of the light guide plate and a light exit surface that is one of plate surfaces of the light guide plate;
    a line of light sources opposed to the light entering surface of the light guide plate, wherein the line of light sources include:
        at least one first outer light source opposed to a first end of the light entering surface and at least one second outer light source opposed to a second end of the light entering surface, wherein each of the at least one first outer light source and the at least one second outer light source is configured to emit light rays in a predefined wavelength range to exhibit a reference color and complementary color light rays in a wavelength range different from the predefined wavelength range to exhibit a color that makes a complementary color pair with the reference color; and
        at least one inner light source disposed between the at least one first outer light source and the at least one second outer light source to be opposed to a middle section of the light entering surface between the first end and the second end, wherein the at least one inner light source is configured to emit primary light rays in the predefined wavelength range to exhibit the reference color; and
    a wavelength converting member containing first phosphors configured to emit secondary light rays in a wavelength range different from the predetermined wavelength range when excited by the primary light rays, wherein the wavelength converting member is disposed to cover the light exiting surface and configured to pass some of the primary light rays and to release planar light.

2. The lighting device according to claim 1, wherein the at least one first outer light source and the at least one second outer light source each include:
    reference light sources configured to emit the primary light rays; and
    wavelength converting members covering the reference light sources, wherein the wavelength converting members: (i) are configured to permit the primary light rays to pass, and (ii) contain second phosphors configured to emit the secondary light rays when excited by some of the primary light rays.

3. The lighting device according to claim 2, wherein the wavelength converting members of the at least one first outer light source and the at least one second outer light source are films containing the second phosphors.

4. The lighting device according to claim 1, wherein the at least one first outer light source and the at least one second outer light source are configured to emit whitish light rays.

5. The lighting device according to claim 1, wherein
    the at least one first outer light source includes a line of first outer light sources,
    the at least one second outer light source includes a line of second outer light sources,
    the line of first outer light sources is configured to emit light that becomes more whitish from a section of the light entering surface at or adjacent to a middle, toward the first end of the light entering surface, and
    the line of second outer light sources is configured to emit light that becomes more whitish from the section of the light entering surface at or adjacent to the middle, toward the second end of the light entering surface.

6. The lighting device according to claim 2, wherein the at least one inner light source, the reference light sources of the at least one outer light source and the at least one second outer light source are a same type.

7. The lighting device according to claim 1, wherein
    the primary light rays are blue light rays,
    the wavelength converting member contains at least green phosphors and red phosphors for the first phosphors,
    the green phosphors are configured to release green light rays as the second light rays when excited by the blue light rays that are the primary light rays,
    the red phosphors are configured to release red light rays as the second light rays when excited by the blue light rays that are the primary light rays, and
    the complementary color light rays emitted by the outer light sources are yellow light rays.

8. The lighting device according to claim 3, wherein the wavelength converting members of the at least one first outer light source and the at least one second outer light source contain at least second green phosphors and second red phosphors for the second phosphors,
    the second green phosphors are configured to release green light rays when excited by blue light rays, and
    the second red phosphors are configured to release red light rays when excited by the blue light rays.

9. The lighting device according to claim 1, wherein the wavelength converting member includes quantum dot phosphors for the first phosphors.

10. The lighting device according to claim 1, further comprising a reflective-type polarizing member disposed to cover the wavelength converting member.

11. A display device comprising:
    the lighting device according to claim 1; and
    a display panel configured to display an image using light from the lighting device.

12. The display device according to claim 11, wherein the display panel is a liquid crystal display panel.

13. A television device comprising the display device according to claim 11.

14. The lighting device according to claim 1, wherein the at least one inner light source includes a line of inner light sources.

* * * * *